United States Patent [19]

Littmann et al.

[11] Patent Number: 5,102,773

[45] Date of Patent: Apr. 7, 1992

[54] PHOTOSENSITIVE RECORDING MATERIAL COMPRISING CARBOXYL-CONTAINING POLYMERIC BINDER HAVING ETHYLENICALLY UNSATURATED SIDE GROUPS AND β-AMINO ALCOHOLS

[75] Inventors: Dieter Littmann, Mannheim; Thomas Telser, Weinheim; Horst Koch, Gruenstadt; Wolfgang Huemmer, Limburgerhof; Martin Meister, Speyer, all of Fed. Rep. of Germany

[73] Assignee: BASF Aktiengesellschaft, Ludwigshafen, Fed. Rep. of Germany

[21] Appl. No.: 424,690

[22] Filed: Oct. 20, 1989

[30] Foreign Application Priority Data

Nov. 3, 1988 [DE] Fed. Rep. of Germany ....... 3837324

[51] Int. Cl.⁵ .................. G03F 7/033; G03F 7/035; G03F 7/037; G03F 7/028
[52] U.S. Cl. .................. 430/283; 430/287; 430/285; 430/919; 430/918; 522/14; 522/18; 522/28
[58] Field of Search ............... 430/287, 919, 918, 285, 430/283; 522/14, 18, 28

[56] References Cited

U.S. PATENT DOCUMENTS

| | | | |
|---|---|---|---|
| 3,264,272 | 8/1966 | Rees | 260/78.5 |
| 4,423,135 | 12/1983 | Chen et al. | 430/271 |
| 4,666,952 | 5/1987 | Henne et al. | 522/14 |
| 4,996,134 | 2/1981 | Enyo et al. | 430/287 X |

FOREIGN PATENT DOCUMENTS

| | | |
|---|---|---|
| 0141110 | 5/1985 | European Pat. Off. . |
| 162570 | 11/1985 | European Pat. Off. . |
| 0261910 | 3/1988 | European Pat. Off. . |
| 2341462 | 2/1974 | Fed. Rep. of Germany . |
| 2122762 | 1/1984 | United Kingdom . |
| 2171107 | 8/1986 | United Kingdom . |

*Primary Examiner*—Cynthia Hamilton
*Attorney, Agent, or Firm*—Oblon, Spivak, McClelland, Maier & Neustadt

[57] ABSTRACT

A photosensitive recording material contains a mixture of carboxyl-containing polymers having ethylenically unsaturated side groups, one or more ethylenically unsaturated monomeric compounds, a photoinitiator and a β-aminoalcohol.

It is suitable for the production of printing plates.

15 Claims, No Drawings

PHOTOSENSITIVE RECORDING MATERIAL COMPRISING CARBOXYL-CONTAINING POLYMERIC BINDER HAVING ETHYLENICALLY UNSATURATED SIDE GROUP AND β-AMINO ALCOHOLS

The present invention relates to a photosensitive water-developable recording material which is particularly suitable for the production of relief printing plates and, in the form of the printing plates obtained therefrom, has high resistance to printing inks based on water and/or oil.

Although there are known printing plates which have sufficient resistance to water-based printing ink, they have serious disadvantages in their handling, for example the necessity for using flammable (ethanol/water mixtures, cf. DE-A-2722421), highly toxic (tetrachloroethylene, cf. U.S. Pat. No. 4,423,135) or strongly alkaline developers (EP-A-0162570) or the necessity of using liquid resins (DE-A-3319676).

It is true that there is also a known photosensitive composition which can be developed with pure water and has a limited press life when used with water-based printing ink (cf. DE-A-3604402 or EP-A-0261910); however, the conjugated diene copolymers described therein have insufficient elastomeric character and swell to an excessive extent in water-based printing ink and therefore do not have a long press life.

It is an object of the present invention to provide improved, photosensitive, layer-like recording materials, in particular for flexographic applications. From these layer-like recording materials, it should be possible to produce, in a simple manner, relief plates which have particularly high resistance to printing ink based on oil and on water.

We have found that this object is achieved, according to the invention, by water-developable, photocrosslinkable or photopolymerizable resilient layer-like recording materials which contain:
one or more carboxyl-containing polymeric binders having olefinically unsaturated side groups,
one or more photopolymerizable monomers having one or more ethylenically unsaturated radicals,
one or more β-aminoalcohols of a certain composition and a photopolymerization initiator and, if required, further conventional assistants and additives.

The present invention therefore relates to a photosensitive recording material which is water-soluble or water-dispersible in the unexposed state but water-insoluble in the exposed state, consisting essentially of
(a) one or more carboxyl-containing polymers having mean molecular weights (weight average) $\overline{M}_w$ of from 5,000 to 1,000,000 and containing ethylenically unsaturated side groups,
(b) one or more photopolymerizable nongaseous monoethylenically or polyethylenically unsaturated monomeric organic compounds,
(c) one or more amines and
(d) one or more photopolymerization initiators, wherein the amine (c) used is a β-aminoalcohol of the general formula (I)

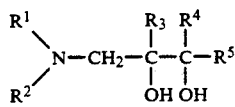

where $R^1$, $R^2$, $R^3$ and $R^4$ are identical or different and are each H or alkyl of 1 to 6 carbon atoms and $R^5$ is H, alkyl of 1 to 3 carbon atoms, $-CH_2-OH$, $-CH_2-CH_2-OH$, $(-CH_2-O-)_n R^6$,

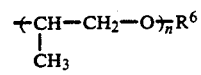

or $(-C_4H_8-O-)R^6$, where $R^6$ is H or alkyl of 1 to 5 carbon atoms and n is from 1 to 20, or a photopolymerizable ethylenically unsaturated radical.

Polymers (a) are, in particular, reaction products of copolymers of ethylene, acrylic acid or methacrylic acid and one or more monomers from the group consisting of the vinyl esters, vinyl ethers, acrylates, methacrylates, acrylamides and methacrylamides with a compound of the general formula (II)

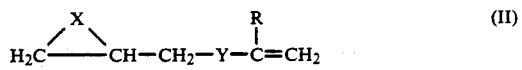

where R is H or $CH_3$, X is O, S or NH, Y is

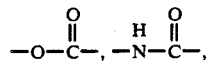

$-O-$ or $C_1-C_{10}$-alkanediyl, and reaction products of copolymers of
(a₁) a conjugated diene of 4 to 6 carbon atoms,
(a₂) an α,β-ethylenically unsaturated carboxylic acid and
(a₃) one or more polymerizable ethylenically unsaturated monomeric organic compounds which differ from those stated under (a₁) and (a₂),
with a compound of the abovementioned formula (II).

Preferred recording materials are mixtures which essentially consist of
from 45 to 90% by weight of the polymer or polymers (a),
from 1 to 40% by weight of the monomeric organic compound or compounds (b),
from 3 to 15% by weight of the β-aminoalcohol or β-aminoalcohols (c) and
from 0.01 to 10% by weight of the photopolymerization initiator or initiators (d),
the sum of the percentages stated under (a) to (d) being 100, and, if required, further conventional assistants and additives.

These can preferably contain, as polymers (a), reaction products of copolymers of
from 30 to 70% by weight of ethylene,
from 5 to 50% by weight of acrylic acid or methacrylic acid and
from 5 to 40% by weight of one or more monomers from the group consisting of the vinyl esters, vinyl ethers, acrylates, methacrylates, acrylamides and methacrylamides, the sum of the abovementioned percentages being 100, with a compound of the general formula (II), and reaction products of copolymers of (a₁) from 5 to 95 mol % of a conjugated diene of 4 to 6 carbon atoms, (a₂) from 1 to 50 mol % of an $\alpha,\beta$-ethylenically unsaturated carboxylic acid and (a₃) from 5 to 60 mol % of one or more polymerizable ethylenically unsaturated monomeric organic compounds which differ from those stated under (a₁) and (a₂), the sum of the molar percentages stated under (a₁) to (a₃) being 100, with a compound of the general formula (II), with the proviso that from 1 to 70% of the carboxyl groups of the copolymer have been reacted with a compound of the formula (II).

The present invention furthermore relates to a process for the production of printing plates which are resistant to water-based and oil-based inks, the novel photosensitive recording material, if necessary in dissolved form, being applied in a layer thickness of from 200 μm to 6 mm to a dimensionally stable substrate and any solvent present being removed.

The novel photosensitive recording materials can be produced and processed in an advantageous manner. It is thus possible to produce water-developable printing plates having relief layers of very great relief height and good side wall shape. The printing plates thus obtainable are stable to chemical and physical effects and have high resistance to printing inks based on oil and on water.

Regarding the components of the novel recording materials, the following may be stated specifically.

(a) Suitable carboxyl-containing binders (a), according to the invention, are carboxyl-containing polymers having mean molecular weights (weight average) $\overline{M}_w$ of from 5,000 to 1,000,000 and containing ethylenically unsaturated side groups.

Preferred carboxyl-containing polymers (a) having olefinically unsaturated side groups are, on the one hand, reaction products of copolymers I of: ethylene (from 30 to 70% by weight), (meth)acrylic acid (from 5 to 50% by weight) and one or more monomers from the group consisting of the vinyl esters, acrylates, vinyl ethers, acrylamides, methacrylates and/or methacrylamides (from 5 to 40% by weight) with compounds of the abovementioned formula (II).

The copolymers I can be prepared, for example, by the LDPE (low density polyethylene) polymerization method at from 200° to 400° C. and under a pressure of more than 800 kg/cm² (cf. for example German Patent 2,341,462, U.S. Pat. No. 3,264,272 and DE-A-35 39 469). Vinyl esters which are particularly suitable comonomers are those of the general formula (III)

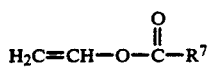

where $R^7$ is an alkyl or cycloalkyl radical of 1 to 10 carbon atoms, e.g. vinyl acetate, vinyl propionate, vinyl butyrate, vinyl valerate or vinyl hexanecarboxylate. Vinyl acetate is preferred. Vinyl ethers which are particularly suitable comonomers are those of the general formula (IV)

where $R^8$ is alkyl of 2 to 8 carbon atoms, e.g. vinyl ethyl ether, vinyl prop-1-yl ether, vinyl prop-2-yl ether, vinyl but-1-yl ether, vinyl but-2-yl ether or vinyl pent-1-yl ether. Vinyl but-1-yl ether is preferred.

(Meth)acrylates and (meth)acrylamides which are particularly suitable comonomers are those of the general formula (V)

where R is H or methyl, $R^9$ is alkyl of 1 to 10 carbon atoms, cycloalkyl or $\omega$-methylpoly(alkylene oxide)-$\alpha$-yl and Z is an oxygen atom or an $NR^{10}$ group where $R^{10}$ is H or $C_1$-$C_4$-alkyl.

Examples of suitable (meth)acrylates and/or (meth)acrylamides are methyl acrylate, methyl methacrylate, ethyl acrylate, propyl acrylate, propyl methacrylate, n-butyl acrylate, n-butyl methacrylate, n-pentyl acrylate, n-pentyl methacrylate, n-hexyl acrylate, n-hexyl methacrylate, tert-butyl acrylate, cyclohexyl acrylate, cyclohexyl methacrylate, 2-ethylhexyl acrylate, 2-ethylhexyl methacrylate, dicyclopentadienyl acrylate, $\omega$-methylpoly(ethylene oxide)-$\alpha$-yl (meth)acrylate, $\omega$-methylpoly(propylene 1,2-oxide)-$\alpha$-yl (meth)acrylate, $\omega$-methylpoly(propylene 1,3-oxide)-$\alpha$-yl (meth)acrylate, etc., N-ethylacrylamide, N-methyl-N-butylmethacrylamide, N-ethyl-N-(2-ethylhexyl)-acrylamide, etc., n-butyl acrylate, 2-ethylhexyl acrylate, $\omega$-methylpoly(ethylene oxide)-$\alpha$-yl acrylate and dicyclopentadienyl acrylate being preferred, of which the first three are particularly preferred.

Preferred copolymers I are ethylene/(meth)acrylic acid copolymers which contain n-butyl acrylate, 2-ethylhexyl acrylate and/or $\omega$-methylpoly(ethylene oxide)-$\alpha$-yl acrylate as polymerized comonomers. Particularly advantageous copolymers I have a Shore A hardness of more than 10, in particular from 15 to 75.

Preferred carboxyl-containing polymers (a) having olefinically unsaturated side groups are, on the other hand, reaction products of copolymers II of (a₁) a conjugated diene of 4 to 6 carbon atoms (from 50 to 90%), (a₂) an $\alpha,\beta$-ethylenically unsaturated carboxylic acid (from 5 to 40%) and (a₃) one or more polymerizable unsaturated monomeric organic compounds which differ from those stated under (a₁) and (a₂) (from 0 to 50%)

with compounds of the abovementioned formula (II).

Examples of compounds which are suitable conjugated diene monomers (a₁) are 1,3-butadiene, isoprene, chloroprene and 1,3-pentadiene.

Suitable ethylenically unsaturated carboxylic acids (a₂) are acrylic acid, methacrylic acid, maleic acid or fumaric acid, monoalkylmaleic half esters and itaconic acid. Methacrylic acid is preferred.

Olefinically unsaturated compounds (a₃) which are suitable comonomers are, for example styrene, acrylates, methacrylates, acrylamides and methacrylamides, for example as mentioned above under the general formula (V), and vinyl ethers, for example as mentioned above under the general formula (IV).

The copolymers II can be prepared, for example, by free radical emulsion polymerization.

To regulate the molecular weight of the copolymers II, a regulator, for example tert-dodecyl mercaptan, in an amount of from 0.1 to 5 g per 100 g of monomer, is usually added to the monomer mixture in the emulsion polymerization. The addition of the individual monomers and the addition of the other polymerization assistants (initiator, emulsifier, regulator, etc.) can be carried out in one feed before the beginning of the polymerization or a little at a time in different feeds. The emulsion polymerization is generally carried out in an oxygen-free atmosphere at from 0° to 100° C. The polymerization can be effected continuously or batchwise. The solids content of the resulting dispersions is in general from 30 to 60%.

To obtain the pure copolymers II, the water present in the dispersion is advantageously removed. The conventional methods, such as freeze drying, devolatilization in an extruder or azeotropic distillation, can be used for this purpose.

Preferred copolymers II are butadiene/methacrylic acid copolymers which contain methyl methacrylate, butyl acrylate and/or lauryl acrylate as additional polymerized comonomers. Particularly advantageous copolymers II have a Shore A hardness of from 5 to 30.

In an advantageous procedure, the olefinically unsaturated side groups can be introduced into the copolymers I and II by partial reaction of the carboxyl groups with oxiran-2-yl, glycidyl, thiiran-2-yl or aziridin-2-yl compounds.

The reaction of carboxyl-containing compounds with oxiran-2-yl, thiiran-2-yl or aziridin-2-yl compounds with ring cleavage and the formation of an α-hydroxy-, α-mercapto- and α-aminoester is known per se and is described in, for example, the company publication Reactive Monomers, Nissan Blemmer G, High Polymer Modifiers (Nippon Oil and Fats, Co. Ltd.) from 1968. It is also known that glycidyl compounds can be used instead of oxiran-2-yl compounds. Advantageously, the copolymers I or II are reacted with these compounds in solvents, such as tetrahydrofuran, toluene, ethylbenzene, methyl ethyl ketone, methyl isobutyl ketone or a mixture thereof. If required, p-dimethylaminopyridine or N-methylimidazole, as a catalyst, and, for example, 2,5-di-tert-butyl-p-cresol or N-nitrosodiphenylamine, as an inhibitor, are added to the solutions of the copolymers I or II. The desired amount of oxiran-2-yl, glycidyl, thiiran-2-yl or aziridin-2-yl compound is added dropwise to these solutions at a rate such that the temperature of the reaction mixture is from 40° to 110° C. If necessary, the temperature is adjusted by heating or cooling. After the dropwise addition, the reaction mixture is advantageously stirred for a further 3–10 hours at 50° C. and the solvent is removed in a suitable manner, for example by distillation under reduced pressure. In a further advantageous procedure, copolymer I or II can be reacted with the abovementioned compounds in a kneader, for example at from 125° to 180° C. for from 3 to 60 minutes, or the reaction can be carried out in a twin-screw extruder, advantageously with a residence time of from 5 to 10 minutes.

The oxiran-2-yl, glycidyl, thiiran-2-yl or aziridin-2-yl compounds of the general formula (II) are preferably reacted with the carboxyl-containing polymers I or II in amounts such that from 1 to 70, preferably from 5 to 40%, of the carboxyl groups of the polymer are reacted with a compound of the general formula (II).

Preferred compounds of the general formula (II) which are used for introducing ethylenically unsaturated side groups into the carboxyl-containing copolymers are glycidyl acrylate and glycidyl methacrylate.

Mixtures of different carboxyl-containing polymers of the abovementioned type are also suitable.

Component (a) is present in the photosensitive recording material in general in amounts of from 45 to 90, preferably from 50 to 85%, by weight.

(b) Suitable photopolymerizable, nongaseous monoethylenically or polyethylenically unsaturated monomeric organic compounds are the ones conventionally used for photopolymerizable recording materials, provided that they are compatible with the other components of the mixture.

Suitable compatible photopolymerizable monomers (b) generally have a boiling point above 100° C. under atmospheric pressure and a molecular weight of not more than 3,000, in particular not more than 2,000. Examples of suitable monomers are the esters of acrylic acid and/or methacrylic acid with monohydric or polyhydric alcohols, such as butyl acrylate, butyl methacrylate, 2-ethylhexyl acrylate, lauryl (meth)acrylate, ethylene glycol di(meth)acrylate, butane-1,4-diol di(meth)acrylate, 3-methylenepentanediol di(meth)acrylate, 2-hydroxypropyl (meth)acrylate, 2-hydroxyethyl (meth)acrylate, hexane-1,6-diol di(meth)acrylate, 1,1,1-trimethylolpropane tri(meth)acrylate, di-, tri- and tetraethylene glycol di(meth)acrylate, tripropylene glycol di(meth)acrylate or pentaerythritol tetra(meth)acrylate, poly(ethylene oxide) di(meth)acrylate, ω-methylpoly(ethylene oxide)-α-yl (meth)acrylate, dihydrodicyclopentadienyl acrylate, isobornyl acrylate, N,N-diethylaminoethyl acrylate or a reaction product of 1 mole of glycerol, 1 mole of epichlorohydrin and 3 moles of acrylic acid; the vinyl esters of aliphatic monocarboxylic acids, such as vinyl oleate; the vinyl ethers of alcohols, such as octadecyl vinyl ether and butane-1,4-diol divinyl ether; the diesters of fumaric and maleic acid, the reaction products of OH-terminated oligomeric polybutadienes with maleic acid or (meth)acrylic acid, i.e. oligomeric polybutadienes being activated, photopolymerizable olefinic double bonds.

In the novel recording materials, component (b), which may consist of individual monomers or a monomer mixture, is used in an amount of from 1 to 40, advantageously from 3 to 30, in particular from 5 to 20%, by weight, based on the total amount of the recording material.

(c) Component (c) is a β-aminoalcohol of the general formula (I)

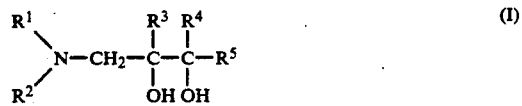

where $R^1$ to $R^5$ have the abovementioned meanings. Examples of particularly preferred β-aminoalcohols are: 2,3-dihydroxyaminopropane, 2,3-dihydroxy-N-methylaminopropane, 2,3-dihydroxy-N,N-dimethylaminopropane, 2,3-dihydroxy-N,N-diethylaminopropane, 2,3-dihydroxy-N,N-methylethylaminopropane, 2,3-dihydroxy-N,N-dipropylaminopropane, 2,3-dihydroxy-N,N-diethylaminobutane, 2,3-dihydroxy-N,N-diethylaminopentane, 2,3-dihydroxy-N,N-diethylaminohexane and N,N-diethyl-2,3-dihydroxyprop-3-yl[ω-hydroxy-poly(ethylene oxide)-1-yl]amine.

$R^5$ in the general formula (I) may furthermore be a photopolymerizable ethylenically unsaturated radical, for example a radical of the formula

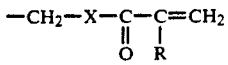

where X is O, S or NH, or

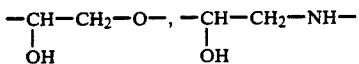

or a radical of the formula

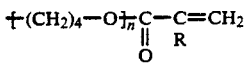

where R is H or CH$_3$ and n is 1 to 20.

These compounds have the advantage that, on the one hand, they increase the compatibility of the components of the formulation and, on the other hand, they result in particularly rapidly developable photosensitive layers which, in the exposed state, have particularly high resistance to printing inks based on oil and on water.

(d) Suitable photopolymerization initiators (d) are likewise those which are conventionally used for photosensitive recording materials and which are compatible with the other components (a) to (c).

Examples of suitable compatible photoinitiators are benzoin or benzoin derivatives, such as its methyl, isopropyl, n-butyl or isobutyl ether; symmetrically or asymmetrically substituted benzil acetals, such as benzil dimethyl acetal or benzil 1-methyl-1-ethyl acetal; acylarylphosphine oxides, such as 2-dimethoxybenzoyldiphenylphosphine oxide, 2,4,6-trimethylbenzoyldiphenylphosphine oxide, ethyl 2,4,6-trimethylbenzoylphenylphosphinate or sodium 2,4,6-trimethylbenzoylphenylphosphinate, or substituted and unsubstituted quinones, such as ethyl anthraquinone or benzanthraquinone, benzophenone or 4,4'-bis-(dimethylamino)-benzophenone. They can be used alone or as a mixture of one another and in conjunction with coinitiators, for example ethylanthraquinone with 4,4'-bis-(dimethylamino)-benzophenone, benzoin methyl ether with triphenylphosphine, diacylphosphine oxides with tertiary amines or acylarylphosphine oxides with benzil methyl acetal.

The novel recording materials contain component (d) in general in an amount of from 0.01 to 10, preferably from 0.1 to 5, in particular from 0.3 to 2%, by weight, based on the total amount of components (a) to (d).

The novel recording materials may contain further conventional assistants and additives, for example plasticizers, thermal polymerization inhibitors, dyes, pigments, photochromic additives, agents for improving the relief structure, crosslinking agents, antioxidants, fillers, flow improvers and/or mold release agents.

Examples of suitable compatible plasticizers are modified and unmodified natural oils and natural resins, such as paraffinic or naphthenic oils, as well as petroleum resins or pentaerythritol esters of hydrogenated rosin; esters of alkyl, alkenyl, arylalkyl or arylalkenyl alcohols with acids such as citric acid, acetic acid, propionic acid, butyric acid, ethylbutyric acid, ethylhexanoic acid, glycollic acid, benzoic acid, phthalic acid, trimellitic acid, abietic acid, phosphoric acid or stearic acid; synthetic oligomers or resins, such as oligostyrene, oligomeric styrene/butadiene copolymers, oligo-α-methylstyrene, oligomeric α-methylstyrene/vinyltoluene copolymers, liquid 1,2- or 1,4-oligobutadienes, oligopentadienes, liquid oligomeric acrylonitrile/-butadiene copolymers and polyterpene, polyacrylate, polyester or polyurethane resins, synthetic polymers such as polyethylene or ethylene/propylene/diene rubbers; α-methyloligo(ethylene oxide) or sulfonamides. Such plasticizers can be added in amounts of from 1 to 25% by weight, based on the mixture of components (a) to (d).

Suitable compatible thermal polymerization inhibitors can be added in general in an amount from 0.001 to 2% by weight, based on the mixture of components (a) to (d), and have no significant self-absorption in the actinic range in which the photoinitiator absorbs. Examples of suitable inhibitors are hydroquinone, p-methoxyphenol, 2,6-di-tert-butylcresol, β-naphthol, phenothiazine, pyridine, nitrobenzene, m-dinitrobenzene or chloranil; thiazine dyes, such as thionine blue G (C.I. 52,025), methylene blue B (C.I. 52,015) or toluidine blue (C.I. 52,040), or N-nitrosamines, such as N-nitrosodiphenylamine, or the salts, for example the potassium, calcium or aluminum salts, of N-nitrosocyclohexylhydroxylamine.

Suitable compatible dyes, pigments or photochromic additives can be added to the mixtures of components (a) to (d) in an amount of from 0.0001 to 2% by weight, based on the mixture. They are used for controlling the exposure properties, identification, direct monitoring of the result of exposure or aesthetic purposes. A precondition regarding the choice and amount of such additives is that they do not interfere with the photopolymerization of the mixtures, this also applying to the thermal polymerization inhibitors. For example, the soluble phenazinium, phenoxazinium, acridinium and phenothiazinium dyes are suitable. These dyes are also used together with a sufficient amount of a reducing agent which cannot reduce the dye in the absence of actinic light but is capable of reducing the dye in the excited electronic state during exposure. Examples of such mild reducing agents are ascorbic acid, anethole, thiourea, for example diethylallylthiourea, in particular N-allylthiourea, and hyroxylamine derivatives, in particular salts of N-nitrosocyclohexylhydroxylamine, preferably the potassium, calcium and aluminum salts. As mentioned above, the latter can also serve as thermal polymerization inhibitors. The reducing agents are generally added in amounts of 0.005 to 5% by weight, based on the mixture, the addition of from 3 to 10 times the amount of concomitantly used dye having proven useful in many cases.

Examples of suitable compatible agents for improving the relief structure of the printing plates produced from the mixtures are 9,9'-dianthronyl and 10,10'-bisanthrone.

Conventional and known tri- and tetrafunctional thiol compounds can be added as crosslinking agents.

To prevent degradation by oxidation or thermal oxidation by atmospheric oxygen, effective amounts of suitable and compatible antioxidants may also be added, for example sterically hindered monophenols, such as 2,6-di-tert-butyl-p-cresol; alkylated thiobis- and alkylidenebisphenols, such as 2,2'-methylenebis-(4-methyl-6-tert-butylphenol) or 2,2'-bis-(1-hydroxy-6-methyl- 6-tertbutylphenyl) sulfide; hydroxybenzyls, such as 1,3,5-trimethyl-2,4,6-tris-(3,5-di-tert-butyl)-4-hydroxybenzyl)-benzene; triazines, such as 2-(4-hydroxy-3,5-tertbutylanilino)-4,6-bis-(n-octylthio)-1,3,5-triazine; polymerized trimethyldihydroquinone; zinc dibutyldithiocarbamate; dilauryl thiodipropionate, or phosphites, such as tris-(nonylphenyl) phosphite. Amounts of from 0.001 to 5% by weight, based on the mixture of components (a) to (d), are advantageous.

Examples of suitable polymeric or nonpolymeric organic and inorganic fillers or reinforcing fillers which are compatible but cannot be mixed in to give a molecular disperse mixture are those which essentially transmit the wavelengths of the light used for exposure of the novel mixtures and do not scatter this light and whose refractive index is substantially tailored to the relevant mixture, for example polystyrene, organophilic silica, bentonite, silica, organophilic alumina, glass powder, colloidal carbon and various types of dyes and pigments. These additives are used in amounts which vary with the desired properties of the novel materials. The fillers have the advantage that they improve the strength of the layers based on the novel photosensitive mixtures, help to reduce the tack and may be an effective color-imparting agent.

It is also possible to add suitable flow improvers, such as calcium stearate, and/or mold release agents, such as talc, in effective amounts.

The amount of assistants and additives which may be present should in general not exceed 50, in particular 30%, by weight of the total amount of the mixture of components (a) to (d) with the assistants and additives.

The novel photosensitive recording materials can be produced by combining the desired amount of components (a) to (d) and if required further additives in the presence or absence of a solvent, and the conventional and known mixing, kneading and dissolution methods may be used.

The mixtures thus obtained can be further processed directly to printing plates or relief printing plates which are crosslinkable by photopolymerization. For this purpose, they are formed into layers of the desired thickness in a conventional manner by casting from a solution, hot pressing, calendering or extrusion. The thickness depends primarily on the intended use of the layers. It varies in general from 0.001 to 7 mm, in particular from 0.025 to 6.5 mm. Printing plates which have layers of this thickness are suitable for the majority of printing techniques.

The layers can be processed as such to give photopolymerizable printing plates, in particular relief printing plates; however, it is advantageous to produce them as a laminate with other layer-like materials before further processing them. Such a laminate is generally referred to as a multilayer element, and the layer of the novel recording material present therein is referred to as the relief-forming layer (RL).

Such a multilayer element usually contains a relief-forming layer (RL), which is bonded to a dimensionally stable substrate (S) firmly or in a readily detachable manner. The dimensionally stable substrate (S) can in turn have a resilient and flexible lower layer (LL). A top layer (TL) and/or a cover sheet (CS) may furthermore be applied to that side of the layer (RL) which faces away from the substrate (S). If a top layer (TL) and a cover sheet (CS) are used together, (TL) is directly on top of the layer (RL), and an antiadhesion layer (AL) may furthermore be present between (TL) and (CS). Furthermore, a firm adhesive bond can be achieved between (CS) and (RL) and, where relevant, (RL) and (CS) with the aid of an adhesion-promoting layer (AP).

Sheets, films or conical or cylindrical sleeves of metals, such as steel, aluminum, copper or nickel, or of plastics, such as polyethylene terephthalate, polybutylene terephthalate, polyamide or polycarbonate, can be used as the dimensionally stable substrates (S). Woven and nonwoven materials, for example glass fiber fabrics or composite materials of, for example, glass fibers and plastics, such as polyethylene terephthalate, are also suitable.

Conventional and known layers of adhesion-forming components which are, for example, from 0.5 to 40 $\mu$m thick can advantageously be used as adhesion-promoting layers (AP).

Suitable top layers (TL) are in general from 0.5 to 20 $\mu$m thick and may consist of a polymer which forms soluble, non-tacky, transparent and strong films, for example polyamide, copolyamide, polyurethane, polyvinyl alcohol, polyvinylpyrrolidone, polyethylene oxide having a molecular weight of more than $10^5$ or cyclized rubber having a high degree of cyclization. (TL) may be matt.

Suitable cover sheets (CS) are in general from 20 to 150 $\mu$m thick and consist of, for example, a polymer such as polyamide or polyethylene terephthalate.

Suitable antiadhesion layers (AA) are in general from 0.1 to 0.5 $\mu$m thick and consist of, for example, silicone resins.

If highly reflective sheets or films are used as the substrate (S), they can contain suitable antihalation agents, such as carbon black or manganese dioxide. The antihalation agents can, however, also be applied to (S) as a separate layer or can be present in the adhesion-promoting layer (AP) or in the relief-forming layer (RL).

Such multilayer elements can be produced by applying the relief-forming layer (RL) to the substrate (S) by casting from solution, hot pressing, calendering or extrusion. The other layers can then be applied in a known manner to this two-layer element. However, it is also possible first to apply the relief-forming layer (RL) to that side of a cover sheet (CS) which is covered with a top layer (TL) and then to bond the uncovered side of the layer (RL) to the substrate (S) so that it is firmly bonded or detachable.

Crosslinked printing plates can be produced, by photopolymerization, from the layers which consist of the novel recording material or from the multilayer elements which contain the relief-forming layers (RL) of novel recording material.

The pretreated or unpretreated layers containing the novel recording material are converted into printing plates crosslinked by photopolymerization in general by imagewise exposure to actinic light having a wavelength of from 230 to 450 nm, advantageously from 300 to 450 nm, through a photographic negative placed on top, washing out of the unexposed and hence uncrosslinked parts of the printing plates with the aid of water or aqueous solutions and drying of the resulting plates which consist of a relief layer (RL') or contain the latter.

Suitable sources of actinic light are commercial UV fluorescent tubes, medium pressure, high pressure and low pressure mercury lamps, superactinic fluorescent tubes, pulsed xenon lamps, lamps doped with metal iodides or carbon arc lamps.

The thickness of the relief layer (RL') of the printing plates crosslinked by photopolymerization varies from 0.001 to 7 mm, depending on the intended use. Thicknesses of from 0.025 to 6.5 mm are advantageous.

The printing plates obtained in this manner can be mounted on printing cylinders and used for printing continuous stationery.

The mixtures based on the novel photosensitive recording materials have many advantages with regard to their preparation and processing. For example, they can very readily be processed by the conventional methods, and in particular their good metering properties in crumb form facilitate charging of extruders, with the result that there is in general no need for the presence of lubricants. The processed photopolymerizable recording materials, printing plates and relief plates are clear and transparent, permitting in particular the production of photopolymerizable printing plates and relief plates having relief layers (RL') with very great relief height and good sidewall shape. This is absolutely essential, for example, for printing on a rough, wavy surface, for example of corrugated board, boxboard or serviettes. Relief heights of more than 3 mm can therefore be produced without problems as in the case of conventionally engraved rubber plates, without the deeper part of the layers becoming clogged through polymerization. Not least, the transparences of the mixtures permits short exposure times without resulting in an unacceptable polymerization gradient in the materials or in the relief layers (RL') of the printing plates and relief plates. The exposed materials, printing plates and relief plates are stable to chemical and physical effects and are nontacky. Moreover, the exposed printing plates and relief plates can be developed with water. The developed materials have high resistance to printing ink based on oil and on water and high abrasion resistance, permitting very long print runs. The main advantages are their developability with water in conjunction with high resistance to water-based printing ink, their ozone cracking resistance and their excellent extensibility and tensile strength.

In the Examples which follow, parts and percentages are by weight, unless stated otherwise.

In the Examples below, acid number means the amount of 100% strength KOH in mg which is required to neutralize the carboxylic acid groups present in 1 g of product. The elongation at break was determined according to DIN 53,504. The tendency to crack in an ozone chamber at an ozone concentration of 50 ppm and at 25° C. was determined on 10 cm long specimens which had been subjected to 10% elongation in length; the criterion for ozone stability was that no cracks occurred in the course of 10 hours. The melt flow index (MFI) was determined at 190° C. under a force of 2.16 kp.

Preparation of the copolymers ($A_1$), ($A_2$) and ($A_3$).

For the Examples according to the invention, the copolymers ($A_1$) and ($A_2$) were prepared by the LDPE (low density polyethylene) high pressure polymerization method. The monomer mixture used for the preparation of ($A_1$) consisted of:
58% of ethylene,
22% of acrylic acid and
20% of 2-ethylhexyl acrylate.

The monomer mixture used for the preparation of ($A_2$) consisted of:
51.5% of ethylene,
20.3% of acrylic acid,
19.4% of $\omega$-methylpoly(ethylene oxide)-$\alpha$-yl acrylate ($\bar{P}=15$, i.e. having 15 ethylene oxide units) and
8.8% of 2-ethylhexyl acrylate.

The melt flow index (MFI) of the copolymer (A) was 20; its acid number was determined as 142. The MFI of the copolymer ($A_2$) was 350; its acid number was determined as 158.

The copolymer ($A_3$) was prepared by emulsion polymerization. The monomer mixture used for the preparation of ($A_3$) consisted of:
55% of butadiene,
25% of acrylic acid,
15% of methyl methacrylate and
5% of lauryl acrylate.

2% by weight, based on the amount of monomer used, of tert-dodecyl mercaptan were added as a regulator to the polymerization mixture. The copolymer ($A_3$), freed from water by freeze drying, had a Shore A hardness of 12. The acid number was 179.

Preparation of copolymer ($A_4$) by the introduction of ethylenically unsaturated side radicals into the copolymer ($A_1$).

1,000 parts of copolymer ($A_1$) were dissolved in 2,000 parts of dry tetrahydrofuran at from 40° to 50° C., together with 0.630 part of p-dimethylaminopyridine and 0.630 part of 2,6-di-tert-butyl-p-cresol. 38 parts of glycidyl methacrylate were added dropwise to a solution in the course of 50 minutes. The resulting solution was stirred for 5 hours at 50° C. After removal of the solvent, the transparent resilient and flexible copolymer ($A_4$), 20% of whose carboxylic acid groups had been esterified, were obtained. The copolymer ($A_4$) contained less than 0.1% by weight, based on ($A_4$), of free glycidyl methacrylate. The content of its free carboxylic acid groups was calculated as 0.25 mole per 100 g of product, this being confirmed by the acid number of 140.

Preparation of copolymer ($A_5$) by the introduction of ethylenically unsaturated side radicals into copolymer ($A_2$).

1,000 parts of copolymer ($A_2$) were dissolved in 2,000 parts of dry tetrahydrofuran at from 40° to 50° C., together with 0.630 part of p-dimethylaminopyridine and 0.630 part of 2,6-di-tert-butyl-p-cresol. 103 parts of glycidyl methacrylate were added dropwise to a solution in the course of 50 minutes. The resulting solution was stirred for 5 hours at 50° C. After removal of the solvent, the transparent resilient and flexible copolymer ($A_5$), 26% of whose carboxylic acid groups had been esterified, was obtained. The copolymer ($A_5$) contained less than 0.1% by weight, based on ($A_5$) of free glycidyl methacrylate. The content of its free carboxylic acid groups was calculated as 0.21 mole per 100 g of product, this being confirmed by the acid number of 116.

Preparation of copolymer ($A_6$) by the introduction of ethylenically unsaturated side radicals in copolymer ($A_3$).

1,000 parts of copolymer ($A_3$) were dissolved in 2,000 parts of dry tetrahydrofuran at from 40° to 50° C., together with 0.630 part of p-dimethylaminopyridine and 0.630 part of 2,6-di-tert-butyl-p-cresol. 82 parts of glycidyl methacrylate were added dropwise to a solution in the course of 50 minutes. The resulting solution was stirred for 5 hours at 50° C. After removal of the solvent, the transparent resilient and flexible copolymer ($A_6$), 20% of whose carboxylic acid groups had been esterified, were obtained. The copolymer ($A_6$) contained less than 0.1% by weight, based on (A$_6$) of free glycidyl methacrylate. The content of its free carboxylic acid groups was calculated as 0.23 mole per 100 g of product, this being confirmed by the acid number of 129.

Preparation and further processing of novel photopolymerizable mixtures based on the copolymers (A$_4$), (A$_5$) and (A$_6$).

EXAMPLE 1

A 70% strength solution consisting of 70 parts of polymer A$_4$, 5 parts of hexanediol diacrylate (HDA$_2$), 5 parts of phenyl glycidyl ether acrylate, 10 parts of n-butylphenylsulfonamide, 7 parts of N,N-diethylamino-2,3-propanediol, 0.2 part of 2,6-di-tert-butylcresol, 2 parts of benzil dimethyl ketal and 0.006 part of Sudan deep black BB (C.I. 26,150) in toluene was poured onto steel sheets provided with an adhesion-promoting layer and dried in the air overnight. The multilayer elements obtained were exposed imagewise to actinic light for 90 seconds through a standard negative The exposed multilayer elements were developed in a commercial brush washer at from 50° to 60° C. using water as the developer. Photopolymerized printing plates which had a substrate (S), an adhesion-promoting layer (AP) and a relief layer (RL) resulted. The relief layer was 0.5 mm thick. The results of the tests on the relief layers are summarized in the Table.

The quality of the relief layers (RL') was determined visually, the reproduction of fine image elements, the planarity of the printing surface, the relief height and the sidewall shape being the criteria on which the evaluation was based. Where all features met the highest quality requirements, the rating very good was awarded, where one feature did not meet these requirements the rating poor was given and where the majority of the features did not meet these requirements the rating useless was awarded.

The printing plates produced according to Example 1 were clamped on a printing cylinder and used for printing on a conventional, flexographic printing unit. The printing plates proved to have very good inking properties and to be resistant to printing ink solvents, abrasion-resistant, non-picking and resistant to cracking. As a result, it was possible to achieve print runs of more than $10^5$ printed copies without the reproduction quality suffering in any way. Even after storage for several weeks, the printing plates still gave the same excellent printed copies.

EXAMPLE 2

A 70% strength solution consisting of 70 parts of polymer A$_5$, 5 parts of hydroxypropyl methacrylate (HPMA), 5 parts of butanediol diacrylate (BDA$_2$), 10 parts of n-butylphenylsulfonamide, 7.5 parts of aminopropane-2,3-diol, 0.2 part of di-tert-butylcresol, 2 parts of benzil dimethyl ketal (BDMK) and 0.006 part of Sudan deep black BB (C.I. 26,150) in toluene was poured onto a 125 µm thick polyethylene terephthalate film provided with a layer of an adhesion-promoting component and an antihalation agent and was dried in the air for 72 hours. The 3 mm multilayer element thus obtained was preexposed uniformly through the polyethylene terephthalate film for 3 minutes and then subjected to a main exposure through a standard negative for 15 minutes in a commerical flatplate exposure unit. The exposed multilayer element was developed with water at from 50° to 60° C. in a commercial brush washer. Photopolymerized printing plates having a total thickness of 2.3 mm and a relief thickness of 0.9 mm resulted. The results of the tests on the relief layers are summarized in the Table.

EXAMPLE 3

A 60% strength solution consisting of 80 parts of polymer (A$_6$), 7 parts of hexanediol diacrylate, 10 parts of n-butylsulfonamide, 7 parts of N,N-diethylamino-2,3-propanediol, 0.2 part of 2,6-di-tert-butylcresol, 2 parts of benzil dimethyl ketal and 0.006 part of Sudan deep black BB (C.I. 26,150) in tetrahydrofuran was poured onto a 125 µm thick polyethylene terephthalate film provided with a layer of adhesion-promoting components and an antihalation agent and was dried in the air for 24 hours. The 3 mm layer thus obtained was then dried for 1 hour at 50° C. and was covered with a 3 µm thick layer of polyvinyl alcohol.

The multilayer element thus obtained was then exposed uniformly from the back for 120 seconds and then exposed imagewise through a standard negative for 15 minutes. The exposure unit used as a commercial 115 W flat-plate exposure unit. The exposed multilayer element was then developed in water at 30° C. in a commercial brush washer to give the plate. A flexible 3 mm thick printing plate having a relief height of 700 µm was obtained. The Shore A hardness of the printing plate was 44. The results of the tests on the plates are summarized in the Table.

EXAMPLE 4

Preparation of a photopolymerizable mixture based on a novel photosensitive recording material and its use for the production of a photopolymerized printing plate.

The mixture was prepared by extrusion of
74 parts of copolymer (A$_2$),
4.8 parts of glycidyl methacrylate,
0.03 part of dimethylaminopyridine,
5 parts of hexanediol diacrylate,
10 parts of a plasticizer (n-butylphenylsulfonamide),
7 parts of N,N-dimethylaminopropane-2,3-diol,
2 parts of benzil dimethyl acetal,
1.164 parts of 2,6-di-tert-p-cresol and
0.006 part of Sudan deep black BB (C.I. 26,150)
in a twin-screw extruder at 150° C. and with a residence time of 3 minutes. The mixture was extruded through a slot die onto a 125 µm thick polyethylene terephthalate film, brought to a thickness of 3,000 µm by calendering and covered with a 3 µm thick layer of polyvinyl alcohol.

The resulting multilayer element (printing plate) was exposed uniformly through the polyethylene terephthalate film for three minutes and then exposed imagewise for 15 minutes through a photographic negative placed on top of the polyvinyl alcohol layer.

After removal of the negative, the printing plate was developed with water at 50° C. in a brush washer. The photopolymerized printing plate thus obtained was dried for 30 minutes at 40° C. in a through-circulation drier.

The printing plate had a very good relief layer (RL') having a relief height of 900 µm. The relief edges and side walls were very well formed; neither underwashing nor edge fragmentation were detectable. The relief layer (RL') met the highest quality requirements. It was therefore rated as very good.

COMPARATIVE EXAMPLES

Preparation and further processing of photopolymerizable mixtures based on photosensitive mixtures not according to the invention.

COMPARATIVE EXAMPLE 1

The procedure described in Example 1 was followed, except that ethylenediamine was used instead of N,N-diethylamino-2,3-propanediol. The layers showed pronounced swelling in water and could not be developed with water.

COMPARATIVE EXAMPLE 2

The procedure described in Example 2 was followed, except that triethanolamine was used instead of aminopropane-2,3-diol. During development of the exposed plates with water in the brush washer, the plate showed very considerable swelling. Small relief parts became detached during development of the plate. Moreover, the surfaces of the relief parts were very rough and had many scattered micro-pits (d=5–15 μm).

COMPARATIVE EXAMPLE 3

The procedure described in Example 4 was followed, except that tri-n-butylamine was used instead of dimethylaminopropane-2,3-diol. The plate could not be developed with pure water.

Evaluation of the comparative experiments shows that the novel photosensitive mixtures are superior to the prior art.

(i) a reaction product of a copolymer of ethylene, at least one of acrylic acid and methacrylic acid and one or more monomers selected from the group consisting of the vinyl esters, vinyl ethers, acrylates, methacrylates, acrylamides and methacrylamides, with a compound of the formula

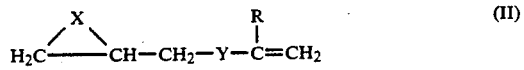

where R is H or CH$_3$, X is O, S or NH and Y is

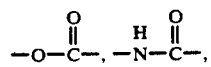

—O— or C$_1$–C$_{10}$-alkanediyl and (ii) a reaction product of a copolymer of
(a$_1$) a conjugated diene of 4 to 6 carbon atoms,
(a$_2$) an α,β-ethylenically unsaturated carboxylic acid and
(a$_3$) one or more polymerizable ethylenically unsaturated monomeric organic compounds which differ from those stated under (a$_1$) and (A$_2$)

with a compound of the formula (II)

(II)

TABLE

Mixtures which can be crosslinked by photopolymerization and are based on the novel photosensitive recording materials (Examples 1 to 4) and on Comparative Examples 1 to 3

| | Amine | Swelling (2 hours) in H$_2$O (% by weight) | Swelling (2 hours) in H$_2$O-based printing ink (% by weight) | Developability in H$_2$O at 50–60° C. |
|---|---|---|---|---|
| Example No. | | | | |
| 1 | N,N-diethylamino-propane-2,3-diol | 1.1 | 1.9 | Yes 60 sec for relief height of 0.5 mm |
| 2 | Aminopropane-2,3-diol | 2.5 | 2.9 | Yes 180 sec for relief height of 0.9 mm |
| 3 | N,N-diethylamino-propane-2,3-diol | 2.2 | 2.5 | Yes 240 sec for relief height of 700 μm |
| 4 | N,N-dimethylamino-propane-2,3-diol | 1.5 | 2.1 | Yes 200 sec for relief height of 0.9 mm |
| Comparative Example | | | | |
| 1 | Ethylenediamine | 6.5 | 9.0 | No |
| 2 | Triethanolamine | 20.3 | 30.6 | Yes 240 sec |
| 3 | Tri-n-butylamine | 6.2 | 8.1 | No |

We claim:

1. A photosensitive recording element for the production of printing plates comprising a dimensionally stable substrate and one or more recording layers of a photosensitive recording material which is water-soluble or water-dispersible before exposure to actinic radiation but water-insoluble in the exposed state, and which consists essentially of (a) one or more carboxyl-containing polymers having mean molecular weights (weight average) M$_w$ of from 5,000 to 1,000,000 and containing ethylenically unsaturated side groups selected from the group consisting of

where R is H or CH$_3$, X is O, S or NH and Y is

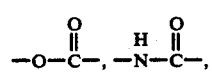

—O— or C$_1$–C$_{10}$-alkanediyl, (b) one or more photopolymerizable nongaseous monoethylenically or polyethylenically unsaturated monomer organic compounds, (c) one or more amines selected from the group consisting of the β-aminoalcohols of the formula (I)

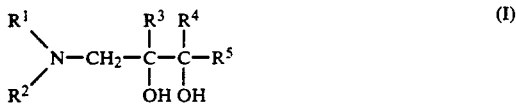 (I)

where $R^1$, $R^2$, $R^3$ and $R^4$ are identical or different and are each H or alkyl of 1 to 6 carbon atoms and $R^5$ is H, alkyl of 1 to 3 carbon atoms, photopolymerizable ethylenically unsaturated radicals, $-CH_2-OH$, $-CH_2-CH_2OH$, $(-CH_2-O-)_nR^6$, $+CH_2-CH_2-O+_nR^6$, $(CH-CH_2-O)_nR^6$,

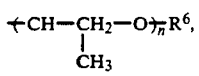

or $+C_4H_8-O+_nR^6$, where $R^6$ is H or alkyl of 1 to 5 carbon atoms and n is from 1 to 20, and (d) one or more photopolymerization initiators.

2. A photosensitive recording element as claimed in claim 1, wherein a reaction product of a copolymer of ethylene, at least one of acrylic acid and methacrylic acid and one or more monomers from the group consisting of the vinyl esters, vinyl ethers, acrylates, methacrylates, acrylamides and methacrylamides, with a compound of the formula (II)

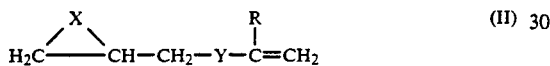 (II)

where R is H or $CH_3$, X is O, S or NH and Y is

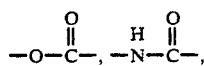

$-O-$ or $C_1-C_{10}$-alkanediyl, is used as polymer

3. A photosensitive recording element as claimed in claim 2, wherein the photosensitive recording material consists essentially of from 45 to 90% by weight of the polymer or polymers (a),
from 1 to 40% by weight of the monomeric organic compound or compounds (b),
from 3 to 15% by weight of the β-aminoalcohol or β-aminoalcohols (c) and
from 0.01 to 10% by weight of the photopolymerization initiator or initiators (d),
the sum of the percentages stated under (a) to (d) being 100.

4. A photosensitive recording element as claimed in claim 3, wherein a reaction product of a copolymer of
from 30 to 70% by weight of ethylene,
from 5 to 50% by weight of acrylic acid or methacrylic acid and
from 5 to 40% by weight of one or more monomers from the group consisting of the vinyl esters, vinyl ethers, acrylates, methacrylates, acrylamides and methacrylamides,
the sum of the abovementioned percentages being 100, with a compound of the formula (II)

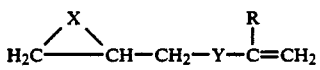 (II)

where R is H or $CH_3$, X is O, S or NH and Y is

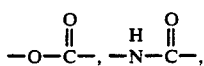

$-O-$ or $C_1-C_{10}$-alkanediyl, is used as polymer (a), with the proviso that from 1 to 70% of the carboxyl groups of the copolymer have been reacted with a compound of the formula (II).

5. A photosensitive recording element as claimed in claim 4, further containing conventional assistants and additives.

6. A photosensitive recording element as claimed in claim 3, further containing conventional assistants and additives.

7. A photosensitive recording element as claimed in claim 2, wherein a reaction product of a copolymer of
from 30 to 70% by weight of ethylene,
from 5 to 50% by weight of acrylic acid or methacrylic acid and
from 5 to 40% by weight of one or more monomers from the group consisting of the vinyl esters, vinyl ethers, acrylates, methacrylates, acrylamides and methacrylamides,
the sum of the abovementioned percentages being 100, with a compound of the formula

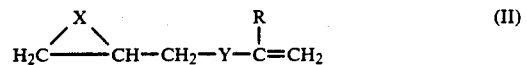 (II)

where R is H or $CH_3$, X is O, S or NH and Y is

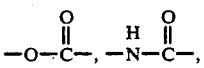

$-O-$ or $C_1-C_{10}$-alkanediyl, is used as polymer (a), with the proviso that from 1 to 70% of the carboxyl groups of the copolymer have been reacted with a compound of the formula (II).

8. A photosensitive recording element as claimed in claim 1, wherein a reaction product of a copolymer of
($a_1$) a conjugated diene of 4 to 6 carbon atoms,
($a_2$) an α,β-ethylenically unsaturated carboxylic acid and
($a_3$) one or more polymerizable ethylenically unsaturated monomeric organic compounds which differ from those stated under ($a_1$) and ($a_2$)
with a compound of the formula (II)

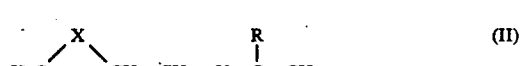 (II)

where R is H or $CH_3$, X is O, S or NH and Y is

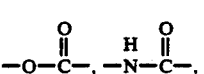

$-O-$ or $C_1-C_{10}$-alkanediyl, is used as polymer (a).

9. A photosensitive recording element as claimed in claim 8, wherein the photosensitive recording material consists essentially of
from 45 to 90% by weight of the polymer of polymers (a), from 1 to 40% by weight of the monomeric organic compound or compounds (b), from 3 to 15% by weight of the β-aminoalcohol or β-aminoalcohols (c) and from 0.01 to 10% by weight of the photopolymerization initiator or initiators (d), the sum of the percentages stated under (a) to (d) being 100.

10. A photosensitive recording element as claimed in claim 9, wherein a reaction product of a copolymer of
   ($a_1$) from 5 to 95 mol % of conjugated diene of 4 to 6 carbon atoms,
   ($a_2$) from 1 to 50 mol % of an α,β-ethylenically unsaturated carboxylic acid and
   ($a_3$) from 5 to 60 mol % of one or more polymerizable ethylenically unsaturated monomeric organic compounds which differ from those stated under ($a_1$) and ($a_2$), the sum of the molar percentages stated under ($a_1$) to ($a_3$) being 100, with a compound of the formula (II)

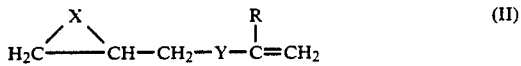

where R is H or $CH_3$, X is O, S or NH and Y is

—O— or $C_1$–$C_{10}$-alkanediyl, is used as polymer (a), with the proviso that from 1 to 70% of the carboxyl groups of the copolymer have been reacted with a compound of the formula (II).

11. A photosensitive recording element as claimed in claim 10, further containing conventional assistants and additives.

12. A photosensitive recording element as claimed in claim 9, further containing conventional assistants and additives.

13. A photosensitive recording element as claimed in claim 8, wherein a reaction product of a copolymer of
   ($a_1$) from 5 to 95 mol % of a conjugated diene of 4 to 6 carbon atoms,
   ($a_2$) from 1 to 50 mol % of an α,β-ethylenically unsaturated carboxylic acid and
   ($a_3$) from 5 to 60 mol % of one or more polymerizable ethylenically unsaturated monomeric organic compounds which differ from those stated under ($a_1$) and ($a_2$), the sum of the molar percentages stated under ($a_1$) to ($a_3$) being 100, with a compound of the formula (II)

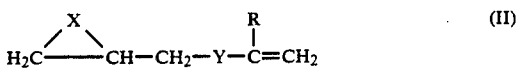

where R is H or $CH_3$, X is O, S or NH and Y is

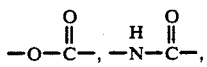

—O— or $C_1$–$C_{10}$-alkanediyl, is used as polymer (a), with the proviso that from 1 to 70% of the carboxyl groups of the copolymer have been reacted with a compound of the formula (II).

14. A photosensitive recording element as claimed in claim 1, wherein the photosensitive recording material consists essentially of
   from 45 to 90% by weight of the polymer or polymers (a),
   from 1 to 40% by weight of the monomeric organic compound or compounds (b),
   from 3 to 15% by weight of the β-aminoalcohol or β-aminoalcohols (c) and
   from 0.01 to 10% by weight of the photopolymerization initiator or initiators (d),
   the sum of the percentages stated under (a) to (d) being 100.

15. A photosensitive recording element as claimed in claim 14, further containing conventional assistants and additives.

* * * * *